United States Patent
Wu et al.

(10) Patent No.: US 12,549,189 B2
(45) Date of Patent: Feb. 10, 2026

(54) ANALOG-TO-DIGITAL CONVERTER (ADC) AUTO-SEQUENTIAL CANNING WITH EXPANSION MULTIPLEXER(S) AND AUXILIARY CIRCUIT CONFIGURATION CONTROL(S)

(71) Applicant: NXP USA, Inc., Austin, TX (US)

(72) Inventors: Chongli Wu, Queen Creek, AZ (US); Zhijie Qin, Wuxi (CN); Yaoqiao Li, Suzhou (CN); Ying Wang, Suzhou (CN)

(73) Assignee: NXP USA, Inc., Austin, TX (US)

( * ) Notice: Subject to any disclaimer, the term of this patent is extended or adjusted under 35 U.S.C. 154(b) by 238 days.

(21) Appl. No.: 18/452,180

(22) Filed: Aug. 18, 2023

(65) Prior Publication Data

US 2024/0088908 A1   Mar. 14, 2024

(30) Foreign Application Priority Data

Sep. 14, 2022   (CN) .......................... 202211112910.X (51) Int. Cl.
   *H03M 1/12*   (2006.01)
(52) U.S. Cl.
   CPC ................................. *H03M 1/1205* (2013.01)
(58) Field of Classification Search
   CPC .......................... H03M 1/1205; H03M 1/1225
   See application file for complete search history.

(56) References Cited

U.S. PATENT DOCUMENTS

| | | | |
|---|---|---|---|
| 6,486,809 B1 | 11/2002 | Figoli | |
| 6,557,131 B1* | 4/2003 | Arabi | H03M 1/109 |
| | | | 714/733 |
| 7,064,700 B1* | 6/2006 | Garrity | H03M 1/1225 |
| | | | 341/161 |
| 7,471,227 B2* | 12/2008 | Cho | H03M 1/1225 |
| | | | 341/161 |
| 7,652,602 B2* | 1/2010 | Miettinen | H03M 3/474 |
| | | | 341/110 |
| 7,916,053 B2 | 3/2011 | Stanley et al. | |
| 7,944,384 B2 | 5/2011 | Fredriksen | |
| 8,248,289 B2* | 8/2012 | Bright | H03M 1/1215 |
| | | | 341/162 |
| 8,633,844 B2* | 1/2014 | Piasecki | H03M 1/468 |
| | | | 341/172 |
| 9,525,420 B2* | 12/2016 | Hematy | H03K 19/017581 |
| 9,548,948 B2* | 1/2017 | Mora Puchalt | H03M 1/124 |
| 10,084,469 B1* | 9/2018 | Pflum | H03M 3/46 |
| 10,355,709 B1* | 7/2019 | Sharma | H03M 3/464 |
| 11,658,674 B2* | 5/2023 | Errico | H03M 1/1225 |
| | | | 341/120 |
| 2006/0022860 A1* | 2/2006 | Storvik, II | H02M 3/33515 |
| | | | 341/155 |

(Continued)

*Primary Examiner* — Lam T Mai (57) ABSTRACT

Systems and methods for Analog-to-Digital Converter (ADC) auto-sequential scanning with expansion multiplexer(s) and auxiliary circuit configuration control(s). In some embodiments, an electronic circuit may include: a multiplexer; an Analog-to-Digital Converter (ADC) coupled to the multiplexer; and a control circuit coupled to the ADC and to the multiplexer, where the control circuit is configured to, as part of an auto-sequential scan, select one of a plurality of input channels coupled to the multiplexer via an expansion multiplexer.

20 Claims, 6 Drawing Sheets

(56) References Cited

U.S. PATENT DOCUMENTS

| | | | | |
|---|---|---|---|---|
| 2008/0278359 A1* | 11/2008 | Wojewoda | ........... | H03M 1/1028 |
| | | | | 341/141 |
| 2009/0195423 A1* | 8/2009 | Li | ......................... | H03M 3/474 |
| | | | | 341/172 |
| 2010/0052962 A1* | 3/2010 | Rzehak | ................ | G01R 21/133 |
| | | | | 341/143 |
| 2010/0245148 A1* | 9/2010 | Adamo | ................... | G06F 13/28 |
| | | | | 341/155 |
| 2011/0304492 A1* | 12/2011 | Mandal | ................... | H03M 1/06 |
| | | | | 341/150 |
| 2012/0050081 A1* | 3/2012 | Bright | ................ | H03M 1/1215 |
| | | | | 341/122 |
| 2014/0002286 A1* | 1/2014 | Bogner | ............... | H03M 1/1225 |
| | | | | 341/122 |
| 2018/0054209 A1* | 2/2018 | Kris | ......................... | H03M 1/60 |
| 2018/0234103 A1* | 8/2018 | Barrenscheen | ..... | H03M 1/1245 |
| 2023/0163772 A1* | 5/2023 | Raju | ................... | H03M 1/0604 |
| | | | | 341/118 |
| 2023/0378972 A1* | 11/2023 | Lin | ....................... | H03M 1/462 |
| 2024/0088908 A1* | 3/2024 | Wu | ..................... | H03M 1/1225 |
| 2024/0305310 A1* | 9/2024 | Chen | ..................... | H03M 1/468 |

* cited by examiner

ANALOG-TO-DIGITAL CONVERTER (ADC) AUTO-SEQUENTIAL CANNING WITH EXPANSION MULTIPLEXER(S) AND AUXILIARY CIRCUIT CONFIGURATION CONTROL(S)

CROSS-REFERENCE TO RELATED APPLICATIONS

This application claims the priority under 35 U.S.C. § 119 of China application no. 202211112910.X, filed on 14 Sep. 2022, the contents of which are incorporated by reference herein.

FIELD

This disclosure relates generally to electronic circuits, and more specifically, to systems and methods for Analog-to-Digital Converter (ADC) auto-sequential scanning with expansion multiplexer(s) and auxiliary circuit configuration control(s).

BACKGROUND

Electrical signals can be measured (or "sampled") using a device known as an Analog-to-Digital converter (ADC). In operation, an ADC receives an analog signal at its input, converts the analog signal into a digital value, and outputs the digital value.

Many applications (e.g., factory automation, automotive, power conversion, motor control, etc.) require the sampling of multiple signals in real-time. In those cases, an ADC may be deployed in conjunction with a control circuit and a multiplexer (MUX). The MUX provides the ADC with a plurality of input channels (e.g., 8, 32, etc.) while the control circuit selects one input channel for sampling by the ADC at a time.

BRIEF DESCRIPTION OF THE DRAWINGS

The present invention(s) are illustrated by way of example and are not limited by the accompanying figures, in which like references indicate similar elements. Elements in the figures are illustrated for simplicity and clarity and have not necessarily been drawn to scale.

DETAILED DESCRIPTION

Technologies and concepts discussed herein relate, in part, to systems and methods for sampling electrical signals using an Analog-to-Digital Converter (ADC) and following a desired sampling sequence.

A sampling sequence may comprise a plurality of samples scheduled in a non-periodic manner, such that the sampling time associated with each sample of the sampling sequence may be independent of the sampling time associated with the other samples of the sampling sequence. In that regard, the time interval between a first sample and a second sample following the first sample is independent of, and may be different from, the time interval between the second sample and a third sample following the second sample. Individual samples of such a sampling sequence may be precisely scheduled with reference to a preceding sample or a hardware event.

The hardware for performing the samples may be configured at the beginning of each Pulse-Width Modulated (PWM) interval, such that the sampling sequence may be completely performed by hardware without interrupts during execution. This sampling process is referred to herein as "auto-sequential scanning," or an "auto-sequential scan."

To sample electrical signals on two or more input channels, an ADC may be deployed in conjunction with a control circuit and a multiplexer (MUX). The MUX provides the ADC with access to a plurality of input channels (e.g., 8, 32, etc.) while the control circuit selects one input channel at a time.

In some cases, the ADC, MUX, and control circuit may be coupled to a processor, Central Processing Unit (CPU), Graphics Processing Unit (GPU), or Microcontroller Unit (MCU) of an electronic device. The electronic device may be fabricated as a monolithic, integrated semiconductor package (or "chip") in the form of a System-on-Chip (SoC), Field-Programmable Gate Array (FPGA), Application-Specific Integrated Circuit (ASIC), Programmable Logic Controller (PLC), Digital Signal Processor (DSP), or the like.

As the number of signals sampled by an ADC grows, multiple MUXes may be deployed in a daisy-chain configuration. For example, in a 2-MUX configuration, a first MUX may have its output coupled to the input of the ADC and a second MUX (referred to as an "expansion MUX") may have its output coupled to an input of the first MUX. Moreover, when an ADC is used to sample different types of analog signals, auxiliary/signal conditioning circuits, such as Operational Amplifiers ("OPAMPs"), may be used to scale signals to match ADC input range, to act as impedance matcher, or to provide active filtering.

In various implementations, expansion MUXes or auxiliary/signal conditioning circuits may be disposed outside of the ADC's core. Additionally, or alternatively, expansion MUXes or auxiliary/signal conditioning circuits may be disposed outside of the semiconductor package where the ADC core resides.

In operation, systems and methods described herein may enable the analog inputs of expansion MUXes to be included in an ADC's auto-sequential scan. Additionally, or alternatively, these systems and methods may enable auxiliary/signal conditioning circuits, such as OPAMPs, to be switched between different configurations as part of the ADC's auto-sequential scan.

Figure 1:
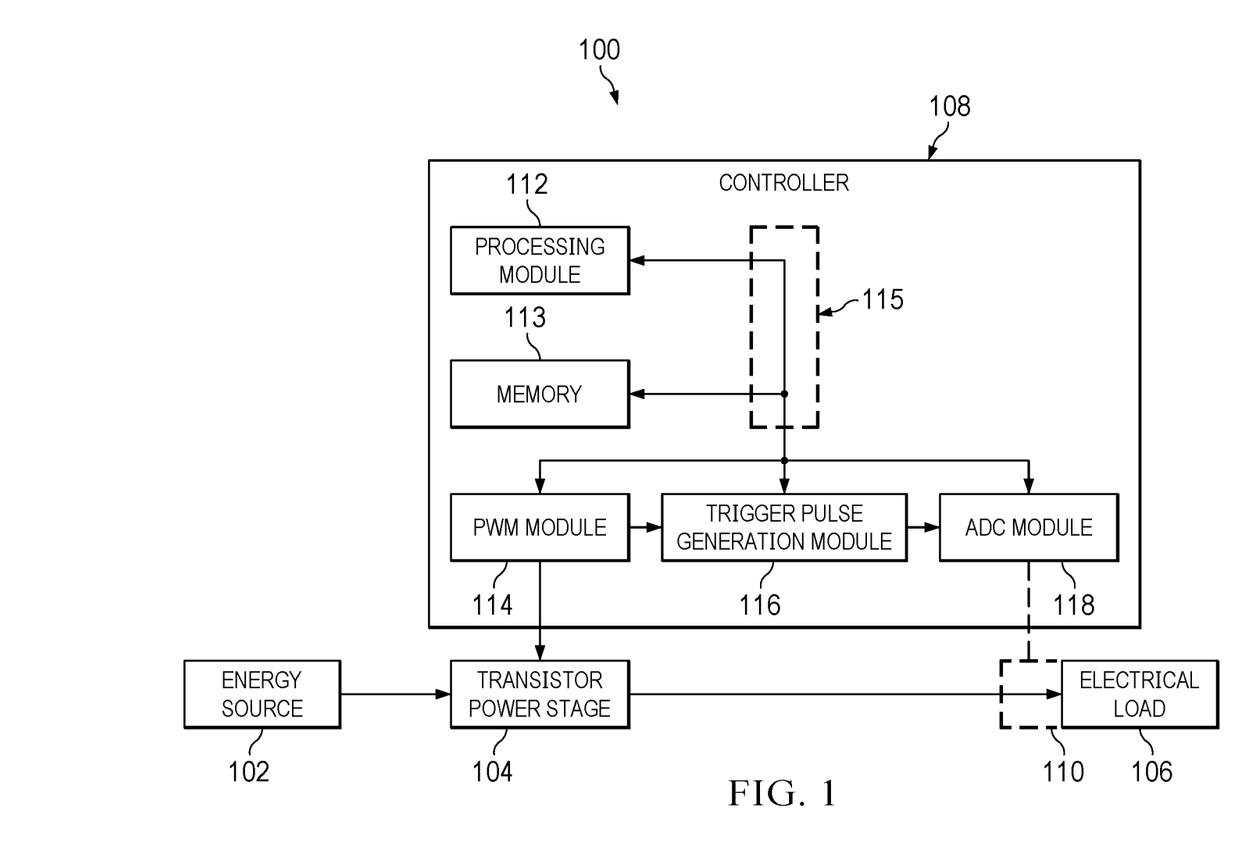
FIG. 1 is a block diagram of an electrical system, according to some embodiments.

FIG. 1 depicts an exemplary embodiment of an electrical system 100. In an embodiment, the electrical system 100 includes, without limitation, an energy source 102, a transistor power stage 104, an electrical load 106, and a controller 108. At the outset, it should be noted that electrical system 100 is provided for purposes of explanation only, and that FIG. 1 is not intended to limit the scope of the subject matter.

As illustrated, the energy source 102 is coupled to the transistor power stage 104, which in turn, is coupled to the electrical load 106. The controller 108 is coupled to the transistor power stage 104 and the electrical load 106, and the elements of the electrical systems 100 are suitably configured to provide electrical power from the energy source 102 to the electrical load 106 using PWM by operating the transistor power stage 104 under control of the controller 108, as described in greater detail below.

Depending on the embodiment, the energy source 102 may be realized as an alternating current (AC) energy source or a direct current (DC) energy source. For example, depending on the embodiment, the energy source 102 may be realized as a battery, a fuel cell, a mains electrical supply, or another suitable energy source known in the art. Similarly, depending on the embodiment, the electrical load 106 may be realized as an AC electrical load or a DC electrical load. The electrical load 106 may be realized as any suitable electrical load, such as, for example, a motor or another suitable electrical component.

In an exemplary embodiment, the transistor power stage 104 is configured to regulate the voltage level (or input current level) provided by the energy source 102 to the input 110 of the electrical load 106. In that regard, the transistor power stage 104 comprises one or more transistors (or switches) configured such that modulating (i.e., turning on or off) the one or more transistors produces a corresponding change in the voltage level at (or input current to) the electrical load 106, where the voltage level at (or input current to) the electrical load 106 is directly proportional to the duty cycle (i.e., the percentage or proportion of time which the transistor is in the "on" or saturated state). The controller 108 is preferably configured to determine PWM signals for modulating the transistor power stage 104 to produce a regulated signal level at the input 110 of the electrical load 106.

In an embodiment, the transistor power stage 104 comprises a switching circuit realized as part of a switched-mode power supply, such as, for example, a rectifier, an inverter, a converter, and the like. For example, in accordance with one embodiment, the energy source 102 is a DC energy source (e.g., a battery, the output of an AC-DC converter, the output of a DC-DC converter) and the electrical load 106 is a DC load (e.g., the internal components of a computer), where the transistor power stage 104 is configured as a voltage converter having a plurality of transistor switches configured such that modulating the transistor switches produces an effective DC voltage level suitable for the electrical load 106 at the input 110 to the electrical load 106.

In this embodiment, the transistor power stage 104 comprises as a voltage regulated output which is coupled to the input 110 of the electrical load 106. In practice, the transistor power stage 104 may operate in conjunction with and include suitably configured electrical energy storage devices, such as capacitors, inductors, and other suitably configured electrical circuitry.

The controller 108 generally represents the hardware, software, and/or firmware components configured to control or otherwise regulate the voltage at the input 110 of the electrical load 106 and perform additional tasks and operations described in greater detail below. In practice, the controller 108 may be realized as an SoC, such as, for example, a digital signal controller (DSC), or a Microcontroller (MCU) or Microprocessor (MPU). In an exemplary embodiment, the controller 108 comprises a processing module 112, a memory 113, a PWM module 114, a trigger pulse generation module 116, and an ADC module 118. The controller 108 may also include additional peripheral modules suitably configured to support operation of the electrical system 100.

In an embodiment, the processing module 112 may be communicatively coupled to the memory 113, the PWM module 114, the trigger pulse generation module 116, and the ADC module 118 over a parallel bus interface 115, although in practice, another suitably configured bus, shared interface, or another interconnection arrangement may be used. In accordance with certain embodiments, the processing module 112 and the peripheral modules 114, 116, 118 may each receive a clocking signal having a clock frequency ($f_{CLK}$) such that the components of the controller 108 operate in a synchronous manner.

The PWM module 114 is coupled to the trigger pulse generation module 116, which in turn is coupled to the ADC module 118. Although not shown in FIG. 1, in practice, the PWM module 114 may be communicatively coupled to the trigger pulse generation module 116 over the bus interface 115, and likewise, the trigger pulse generation module 116 may be communicatively coupled to the ADC module 118 over the bus interface 115.

Depending upon the embodiment, the processing module 112 may be implemented or realized with a general-purpose processor, a content addressable memory, a digital signal processor, an ASIC, an FPGA, any suitable programmable logic device, discrete gate or transistor logic, discrete hardware components, or any combination thereof, designed to perform the operations described herein. The processing module 112 may also be implemented as a combination of computing devices, e.g., a combination of a digital signal processor and a microprocessor, a plurality of microprocessors, one or more microprocessors in conjunction with a digital signal processor core, or any other such configuration. In practice, the processing module 112 includes processing logic that may be configured to carry out the operations, techniques, and processing tasks associated with the operation of the controller 108, as described in greater detail below.

Furthermore, the operations of methods or algorithms described in connection with embodiments disclosed herein may be performed directly in hardware, in firmware, in a software module executed by the processing module 112, or in any practical combination thereof. In this regard, the processing module 112 may access a suitable amount of memory 113 configured to support operations of the controller 108, as described below. The memory 113 may be realized as RAM memory, ROM memory, flash memory, registers, a hard disk, a removable disk, or any other form of storage media known in the art or any suitable combination thereof. Although the memory 113 and the processing module 112 are shown as separate elements, in practice, the memory 113 may be integral with the processing module 112.

In the illustrated embodiment, the PWM module 114 generally represents the hardware, software, and/or firmware components configured to utilize PWM signals to modulate the transistors of the transistor power stage 104 based on a set of PWM parameters and patterns determined and/or provided by the processing module 112, as described in greater detail below. The trigger pulse generation module 116 generally represents the hardware components configured to generate timing trigger signals for the ADC module 118, as described in greater detail below. In various embodiment, the timing trigger signal may include a pulse signal which causes the ADC module 118 to perform an analog-to-digital conversion in response to the timing trigger signal. For example, the trigger pulse generation module 116 may generate timing trigger signals for a state machine within the ADC module 118 which causes the ADC module 118 to perform an analog-to-digital conversion based on the current state of the state machine within the ADC module 118, where after performing the action the state machine transitions to its next state.

The ADC module 118 generally represents the hardware components coupled to the input 110 of the electrical load 106 configured to obtain and/or sample the voltage level at the input 110 of the electrical load 106. In this regard, the ADC module 118 and/or controller 108 may be coupled to the input 110 of the electrical load 106 via one or more analog sensors (e.g., voltage and/or current sensors).

In an embodiment, the ADC module 118 samples and/or performs an analog-to-digital conversions at selected sampling times based in part on one or more timing trigger signals provided by the trigger pulse generation module 116, as described in greater detail below. In accordance with one or more embodiments, the ADC module 118 is configured to perform a sampling sequence for a plurality of samples and generates an interrupt after obtaining the plurality of samples in accordance with the sampling sequence. As described in greater detail below, the ADC module 118 is configurable to obtain a sample at in response to a timing trigger signal or by automatically performing an analog-to-digital conversion after a previous sample.

As used herein, the terms "automatically performing an analog-to-digital conversion," "automatically converting," "automatically sampling," "automatically obtaining a sample," "automatically generating a sampling trigger signal," and variations thereof should be understood as referring to sampling an analog signal at a sampling time based on the sampling time of the immediately preceding sample. Depending on the embodiment, the sampling time of the automatically obtained sample may occur at the next possible sampling time after the previous sampling time (e.g., the sampling time of an immediately preceding sample) or at some other interval after the previous sampling time. In this regard, if a first sample is obtained at a first sampling time ($T_N$) in response to a timing trigger signal, a second sample automatically obtained after the first sample is obtained at a second sampling time ($T_N+\Delta$), where $\Delta$ represents an amount of time between successive samples.

Figure 2:
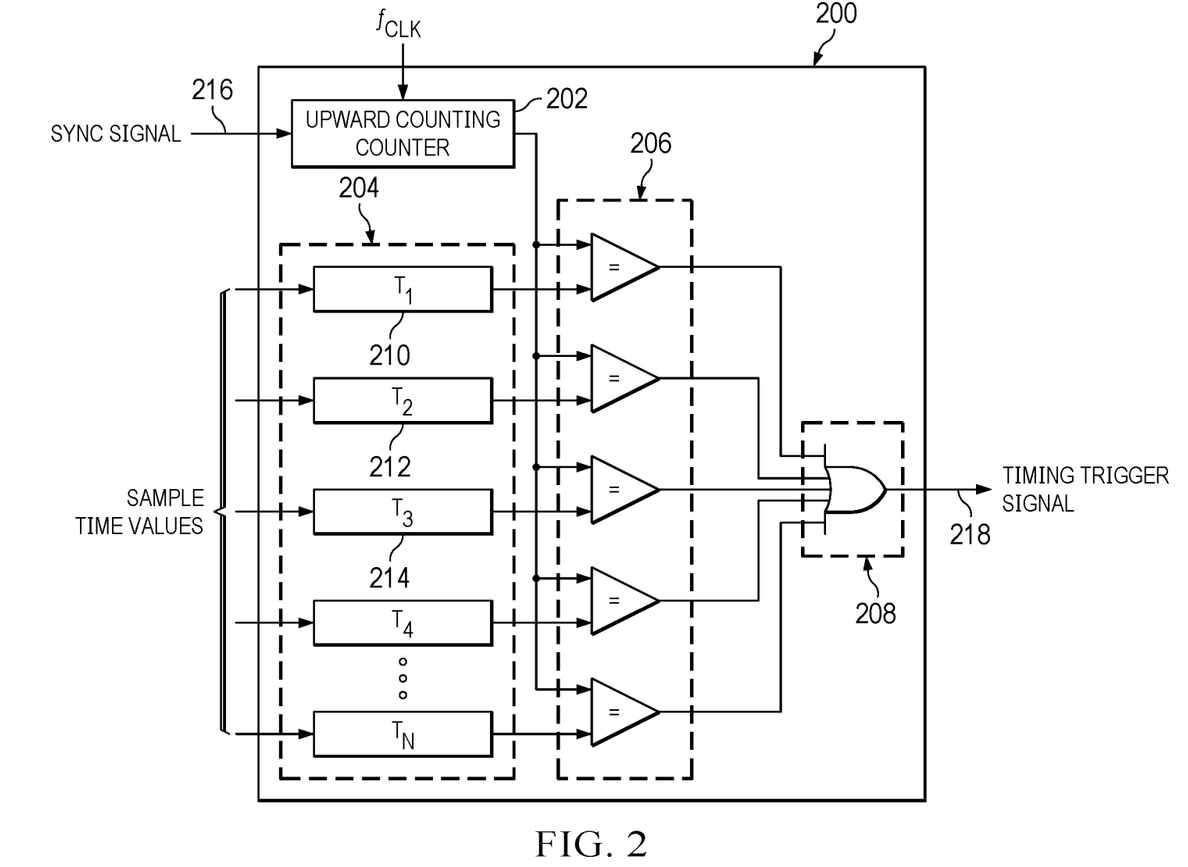
FIG. 2 is a block diagram of an example of a trigger pulse generation module, according to some embodiments.

FIG. 2 depicts an embodiment of a trigger pulse generation module 200 suitable for use as a trigger pulse generation module 116 in the electrical system 100 of FIG. 1. It should be noted that trigger pulse generation module 200 is provided for purposes of explanation only, and that FIG. 2 is not intended to limit the scope of the subject matter.

As illustrated, the trigger pulse generation module 200 includes, without limitation, a counter 202, a plurality of registers 204, a plurality of digital comparators 206, and a logical OR gate 208. It should be noted that although FIG. 2 depicts the registers 204 within the trigger pulse generation module 200, in practice, the registers 204 may be implemented as part of memory 113 and communicatively coupled to the trigger pulse generation module 200.

As described in greater detail below, in an embodiment, the trigger pulse generation module 200 is configured to provide one or more timing trigger signals 218 to the ADC module 118 based on the value of the counter 202 and the values stored in the plurality of registers 204. In this regard, the trigger pulse generation module 200 comprises N number of registers 204 and N number of comparators 206 suitably configured to support operation of the trigger pulse generation module 200.

The trigger pulse generation module 200 may be configured for any number of timing trigger signals, and practical embodiments may include additional components suitably configured to support operation of the trigger pulse generation module 200.

The counter 202 may be configured as synchronous upward counting counter which initializes and/or resets to a zero value in response to a sync signal 216. In an exemplary embodiment, the sync signal 216 is generated by the PWM module 114. In this regard, the sync signal 216 should be understood as referring to a pulse signal from the PWM module 114 that corresponds to the PWM module 114 beginning a new cycle, as described in greater detail below.

In an embodiment, the registers 204 are coupled to the processing module 112 and configured to store digital values (e.g., sample time values) that correspond to particular sampling times (or timing references) after the sync signal 216 is received from the PWM module 114 such that the trigger pulse generation module 200 generates timing trigger signals 218 at the particular times after the sync signal 216. The value stored in each respective register 204 is equal to the value of a desired time (e.g., $T_N$) for a respective timing trigger signal multiplied by the clocking frequency of the counter 202 (e.g., $f_{CLK}$).

As shown in FIG. 2, each register 204 is coupled to the input of digital comparator 206, and each digital comparator 206 has another input coupled to the counter 202 and configured to receive the current value (or count) of the counter 202. In an embodiment, the digital comparators 206 are configured such that the output of a respective comparator 206 is a logical '1' when the value of the counter 202 is equal to the value stored in the register 204 associated with the respective comparator 206, and otherwise, the output of the respective comparator 206 is a logical '0'.

The logical OR gate 208 comprises N number of inputs, where each input is coupled to an output of a respective comparator 206, and the output of the logical OR gate 208 is coupled to the ADC module 118.

As such, when the output of any of the digital comparators 206 is a logical '1', the output of the logical OR gate 208 changes to a logical '1' and thereby generates a timing trigger signal 218. The trigger pulse generation module 200 generates any number of timing trigger signals 218 for the ADC module 118, where each timing trigger signal is generated at a particular time after the sync signal 216 from the PWM module 114.

Figure 3A:
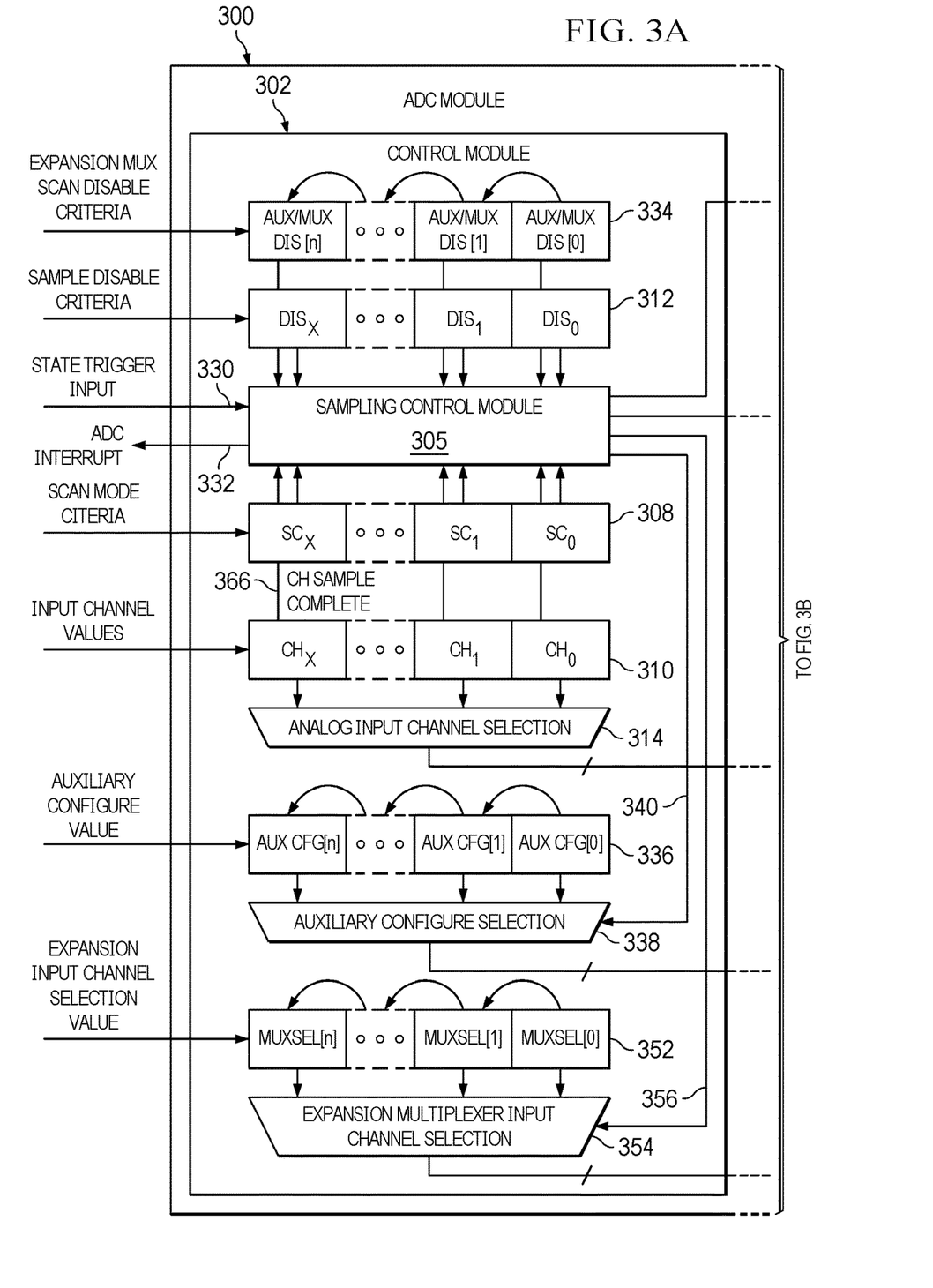
FIGS. 3A and 3B a block diagram of an example of an Analog-to-Digital Conversion (ADC) module, according to some embodiments.
Figure 3B:
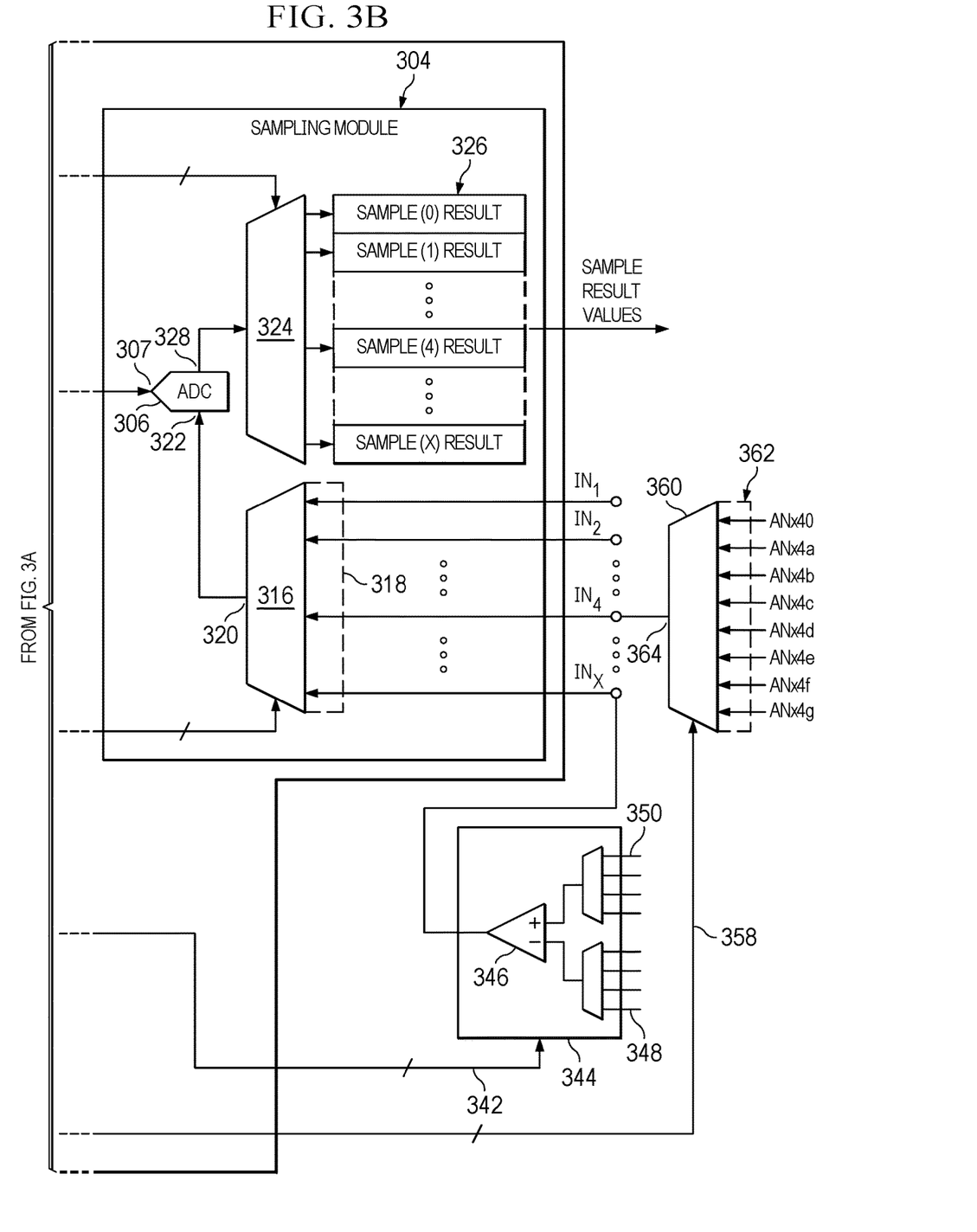

FIGS. 3A and 3B depict an exemplary embodiment of an ADC module 300 suitable for use as an ADC module 118 in the electrical system 100 of FIG. 1. It should be noted that ADC module 300 is provided for purposes of explanation only, and that FIGS. 3A and 3B are not intended to limit the scope of the subject matter.

As illustrated, the ADC module 300 includes, without limitation, an ADC control module 302 and a sampling module 304. The ADC control module 302 represents the hardware components configured to cause the hardware components of the sampling module 304 to identify and/or select a desired analog input, convert the analog input to a corresponding digital value, and store the digital value in an appropriate location.

The ADC control module 302 includes a sampling control module 305, a scan control register (SC) 308, a channel list register (CH) 310, a sample disable register (DIS) 312, a channel selection multiplexer (MUX) 314, an auxiliary (AUX) configuration and expansion MUX (AUX/MUX) disable register 334, an auxiliary configuration list register (AUXCFG) 336, an auxiliary configuration multiplexer 338, an expansion MUX input channel selection register (MUXSEL) 352, and an expansion MUX channel selection multiplexer 354. Although FIGS. 3A and 3B depict the registers 308, 310, 312, 334, 336, and 352 within the ADC control module 302, in practice, any of these registers may be implemented as part of memory 113 and communicatively coupled to the ADC control module 302.

The following description of FIGS. 3A and 3B is divided into two parts. In Part I, the use of registers 308, 310, and 312 during an auto-sequential scan of input channels 318 ($IN_1$ through $IN_X$) of first or integrated MUX 316 is described. In Part II, the use of registers 334, 336, and 352 is described for including additional input channels 362 (ANx40 through ANx4g) of expansion MUX 360, as well as the configuration of auxiliary/signal conditioning circuit 344, in the auto-sequential scan.

With respect to Part I, the sampling control module 305 is coupled to the scan control register 308, the sample disable register 312, a channel list register 310 and the channel selection MUX 314. In an embodiment, the sampling control module 305 is also communicatively coupled to the trigger pulse generation module 116, 200 (e.g., at the output of the logical OR gate 208) and the processing module 112. The registers 308, 310, and 312 are also coupled to the processing module 112 and configured to store values corresponding to particular samples of a sampling sequence determined by the processing module 112. The sample disable register 312 stores and/or maintains sample disable criteria that is utilized to control the number of samples obtained by the ADC module 300 per scan.

The sampling control module 305 is configured to generate sampling trigger signals (or alternatively, ADC trigger signals) at a trigger input 307 of the ADC 306 within the sampling module 304 in response to either a timing trigger signal at a timing trigger input 330 or based on a scan mode criterion from the scan mode register 308 for a respective sample. In an embodiment, the timing trigger input 330 is coupled to the trigger pulse generation module 116, 200 and configured to receive timing trigger signals 218 from the trigger pulse generation module 116, 200.

The sampling control module 305 may be implemented as a state machine configured to carry out the operations, techniques, and processing tasks associated with a scan mode sampling process. However, in other embodiments, the sampling control module 305 may be realized with a general-purpose processor, a content addressable memory, a DSP, an ASIC, an FPGA, any suitable programmable logic device, discrete gate or transistor logic, discrete hardware components, or any combination thereof, designed to perform the operations described herein.

In some cases, the ADC 306 may be implemented as a Nyquist rate cyclic ADC that converts an analog signal level at the analog input 322 of the ADC 306 into a corresponding digital value at the digital output 328, in response to a sampling trigger signal (or alternatively, an ADC trigger signal) at its trigger input 307. In this regard, the sampling trigger signal comprises to a pulse signal provided by the sampling control module 305 to the trigger input 307 of the ADC 306 which causes the ADC 306 to perform an analog-to-digital conversion. In effect, the sampling trigger signal operates as a start signal or an enable signal for the ADC 306. It should be noted that in practice, the ADC 306 may be realized using any suitable analog-to-digital converter type (e.g., flash ADC, sigma-delta ADC, etc.) that is capable of performing analog-to-digital conversions in response to a sampling trigger signal from the sampling control module 305.

In an embodiment, the ADC 306 may convert the analog signal level at the analog input 322 to a multi-bit digital value at the digital output 328, however, in other embodiments, the ADC 306 may convert the analog signal at the analog input 322 to a single-bit digital value. As described in greater detail below, in some embodiments, the ADC 306 may have a minimum time ($\Delta$) between obtaining successive samples, or in other words, the $\Delta$ corresponds to the minimum difference in sampling times for two successive samples.

In an exemplary embodiment, the sampling module 304 includes an analog input multiplexer 316 ("first MUX") having a plurality of analog inputs 318 ($IN_1, IN_2, \ldots, IN_X$), a digital demultiplexer 324, and a result register 326. The output 320 of the input multiplexer 316 is coupled to the analog input 322 of the ADC 306, and the input of the digital demultiplexer 324 is coupled to the digital output 328 of the ADC 306.

The channel list register 310 comprises identification information, such as, for example, input channel numbers that correspond to a particular input of the plurality of inputs 318 to the sampling module 304 for a respective sample. As described in greater detail below, the input channel numbers stored and/or maintained in the channel list register 310 are based on a predetermined sampling sequence. The output of the channel selection MUX 314 is coupled to the selection input of the analog input multiplexer 316, and the sampling control module 305 and the channel selection MUX 314 are cooperatively configured to select the appropriate input channel for a respective sample of the sampling sequence based on the contents of the channel list register 310 that correspond to the respective sample.

In an embodiment, the sampling control module 305 is also coupled to the selection input of the digital demultiplexer 324, and the sampling control module 305 and the digital demultiplexer 324 are cooperatively configured such that the digital value obtained by the ADC 306 is stored or maintained in the appropriate location within the result register 326 that corresponds to the appropriate sample. In this regard, the digital demultiplexer 324 has a plurality of outputs coupled to the result register 326, where the sampling control module 305 selects the appropriate output for a respective sample.

In operation, processing module 112 determines scan mode criteria for each sample of the sampling sequence based on the sampling schedule. In this regard, the scan mode criteria indicate whether a sample should be automatically obtained, or alternatively, obtained in response to a hardware event. For example, as described in greater detail below, a scan mode criterion equal to a logical '0' indicates a sample to be performed immediately and/or automatically after the preceding sample (e.g., automatic sampling mode) while a scan mode criterion equal to logical '1' corresponds to a sample to be performed at a timing trigger signal (or an external event) at a timing trigger input 330 (e.g., after the PWM cycle begins). In other words, a scan mode criterion equal to logical '0' corresponds to a sampling time referenced relative to the preceding sample, whereas a scan mode criterion equal to logical '1' corresponds to a sampling time referenced relative to an external event (e.g., the sync signal indicating the beginning of the PWM cycle).

For sake of illustration, consider a scenario where the scan mode criteria for the first, second, and fourth samples are determined as logical '1', as the timing for each of the respective samples is referenced relative to external events (e.g., the beginning of the PWM cycle), whereas the scan mode criteria for the third and fifth samples are determined as logical '0', as the timing for each of the third and fifth samples is referenced relative to the timing of the preceding sample. As a result, a time interval (or difference) between the first sample and the second sample may be different than a time interval between the second sample and the third sample, which may be different than a time interval between the third sample and the fourth sample, and so on.

The sampling time for each sample of the sampling sequence may be independent of the other samples of the sampling sequence. In other words, the sampling sequence may be nonperiodic, that is, at least one sample does not occur at regular intervals with respect to the preceding and/or succeeding samples. It should be noted that although the scan mode criteria is described herein as a single-bit value for purposes of explanation, the scan mode criteria may be implemented using additional bits and the subject matter is not intended to be limited to single-bit scan mode criteria.

Processing module 112 configures the trigger pulse generation module 116, 200 to generate timing trigger signals corresponding to the particular timing references after, for example, the PWM sync signal, based on the sampling schedule for the sampling sequence. For example, processing module 112 may configure the first register 210 to contain (or store) a value corresponding to $T_1$ (e.g., $T_1 \times f_{CLK}$), a second register 212 to contain a value corresponding to $T_2$ (e.g., $T_2 \times f_{CLK}$), and a third register 214 to contain a value corresponding to $T_3$ (e.g., $T_3 \times f_{CLK}$).

The processing module 112 may also configure each of the remaining registers 204, which are not being used for the current sampling sequence to contain (or store) a null value or another suitable value such that the trigger pulse generation module 200 does not generate any undesired timing trigger signals (or external events) that may interfere with the proper execution of the sampling sequence. In this manner, the trigger pulse generation module 116, 200 generates a plurality of timing trigger signals based on the sampling schedule during execution of the upcoming PWM cycle.

In an exemplary embodiment, the processing module 112 also configures the ADC module 118, 300 for generating sampling trigger signals at the trigger input 307 of the ADC 306 based on the sampling sequence. In this regard, the scan control register 308 obtains the scan mode criteria for the plurality of samples of the sampling sequence from the processing module 112. In some embodiments, the scan mode criteria are arranged in a sequential manner within the scan control register 308, for example, a first bit of the scan control register 308 corresponds to the first sample of the sampling sequence, a second bit of the scan control register 308 corresponds to the second sample of the sampling sequence, and so on.

Processing module 112 also configures the ADC module 118, 300 with other information for performing the sampling sequence. For example, the processing module 112 may configure the channel list register 310 such that the appropriate input channel for the sampling module 304 is selected based on the sampling sequence. The processing module 112 may also configure the sample disable register 312 with sample disable criteria such that the ADC module 300 does not obtain additional samples other than those prescribed by the sampling sequence. In an embodiment, the ADC module 300 or sampling control module 305 generates an interrupt signal 332 (alternatively referred to as the ADC interrupt) in response to determining that all the samples of the sampling sequence have been obtained based on the contents of the sample disable register 312.

In some implementations, in response to configuring the hardware components for the upcoming PWM cycle, the processing module 112 may indicate to the PWM module 114 to begin the PWM cycle, or the PWM module 114 may begin the PWM cycle automatically (e.g., without interaction of the processing module 112). The PWM module 114 generates PWM signals for the PWM cycle based on the set of PWM parameters determined and/or provided to the PWM module 114. In addition, the processing module 112 may reset or otherwise initialize the state machine that comprises the sampling control module 305, such that the sampling control module 305 is restored to a first or initial state upon initiation of the PWM cycle.

In response to initiating the PWM cycle, the sampling sequence determined above may be performed until receiving an interrupt signal. In this regard, the PWM module 114 may generate a sync signal when the PWM module 114 begins execution of the set of PWM parameters for the PWM cycle. In response to the sync signal 216 from the PWM module 114, the counter 202 within the trigger pulse generation module 200 begins counting upwards, such that the trigger pulse generation module 200 generates a plurality of timing trigger signals 218 at predetermined times (e.g., based on values stored in the registers 204) after the sync signal 216.

The ADC module 118, 300 obtains the plurality of samples for the sampling sequence by performing a scan mode sampling process. In an embodiment, the ADC module 118, 300 generates an interrupt signal in response to completing the scan mode sampling process, and in response to the interrupt signal, the digital values stored in sample result register 326 corresponding to the plurality of samples of the sampling sequence are retrieved by processing module 112.

Depending on the implementation, a set of PWM parameters may be determined for the next PWM cycle based upon the measured or otherwise obtained digital values that correspond to the plurality of samples by comparing the digital values obtained by the ADC module 118, 300 to the desired (or expected) values (e.g., values corresponding to the desired analog signal levels). In this regard, a new set of modulation parameters may be determined for the next PWM cycle based on the digital values corresponding to the plurality of samples from the previous PWM cycle. A sampling sequence may be determined based on the new set of modulation parameters, and the controller hardware may be configured based on the sampling sequence, in a similar manner as described above.

Now with respect to Part II, the sampling control module 305 is coupled to the AUX/MUX disable register 334, the auxiliary configuration register 336, and the expansion MUX channel selection register 352. In combination, registers 334, 336, and 352 enable the inclusion of input channels 362 (ANx40-g) of expansion MUX 360, as well as the configuration of auxiliary/signal conditioning circuit 344, in the auto-sequential scan.

As illustrated, expansion MUX 360 is configured to receive a selection signal 358 from expansion MUX channel selection multiplexer 354, whereas auxiliary/signal conditioning circuit 344 is configured to receive one or more configuration signals 342 from auxiliary configuration multiplexer 338. An output 364 of expansion MUX 360 is coupled to a first one of input channels 318 (e.g., $IN_4$), and an output of auxiliary/signal conditioning circuit 344 is coupled to a second one of input channels 318 (e.g., $IN_X$).

The output 358 of expansion MUX channel selection multiplexer 354 may include an n-bit value usable to select one of signals 362 to be sampled. Meanwhile, the output 342 of auxiliary configuration multiplexer 338 may include any number or values (e.g., two) usable to select, via multiplexers 348 and 350, one of a plurality of different possible configurations for an inverting input and a non-inverting input of programmable OPAMP 346. In some cases, output 342 may set OPAMP 346 as a unit gain follower, a gain amplifier, a differential amplifier, a low-pass filter, a high-pass filter, or an inverter.

To include any of input channels 362 in an auto-sequential scan by ADC 328, the expansion MUX channel selection register 352 may include an ordered list of channels, among input channels 362 of expansion MUX 360, to be sampled when a next auto-sequential scan is initiated. For example, the expansion MUX channel selection register 352 may include a 3-bit field that selects one of eight possible input channels.

If and while $IN_4$ is selected (via channel list register 310), the auto-sequence scan proceeds in order from MUXSEL[0] through MUXSEL[n] under control of the sampling control module 305.

Similarly, to include the selection of an OPAMP configuration in the auto-sequential scan prior to sampling $IN_4$ or $IN_X$ (e.g., to account for a settling or stabilization of auxiliary/signal conditioning circuit 344), the auxiliary configuration register 336 may include an ordered list of configuration values to be applied to auxiliary/signal conditioning circuit 344 when the next auto-sequential scan is initiated. Each configuration value may be applied at a time preceding the sampling, and that time may be calculated, at least in part, based upon an ADC conversion time. For example, the auxiliary configuration register 336 may include a 2-bit field that selects a configuration of auxiliary/signal conditioning circuit 344.

If and while $IN_X$ is selected (via channel list register 310), the auto-sequence scan proceeds in order from AUXCFG[0] through AUXCFG[n] under control of the sampling control module 305.

The AUX/MUX disable register 334 is an extension to sample disable register 312. Particularly, the AUX/MUX disable register 334 provides the ability to enable only the desired samples programmed in the expansion MUX channel selection register 352. For example, if bit sample 'AUX/MUX DISC' were set to '1,' the ADC's start signal would scan from sample '0' through '6,' but samples 7 through n would not be sampled.

Once any sampling operation of $IN_4$ (i.e., for any of input channels 362) or $IN_X$ is completed, a sample complete signal 366 is provided to sampling control module 305 and the current index for expansion MUX channel selection register 352 (MUXSEL), auxiliary configuration register 336 (AUXCFG), and AUX/MUX disable register 334 is incremented.

Figure 4A:
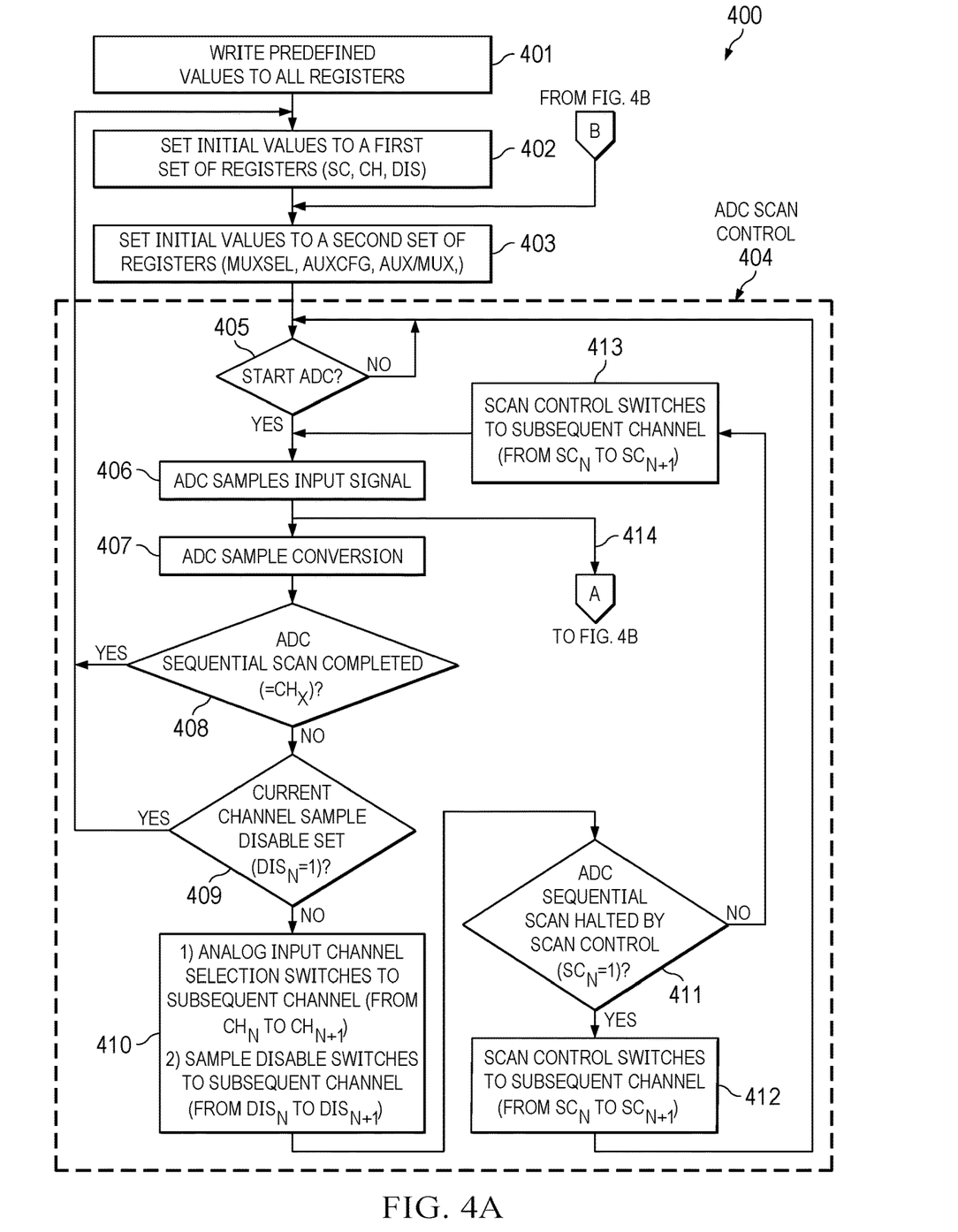
FIGS. 4A and 4B are a flowchart of an example of an auto-sequential scanning method with expansion multiplexer(s) and auxiliary circuit configuration control(s), according to some embodiments.
Figure 4B:
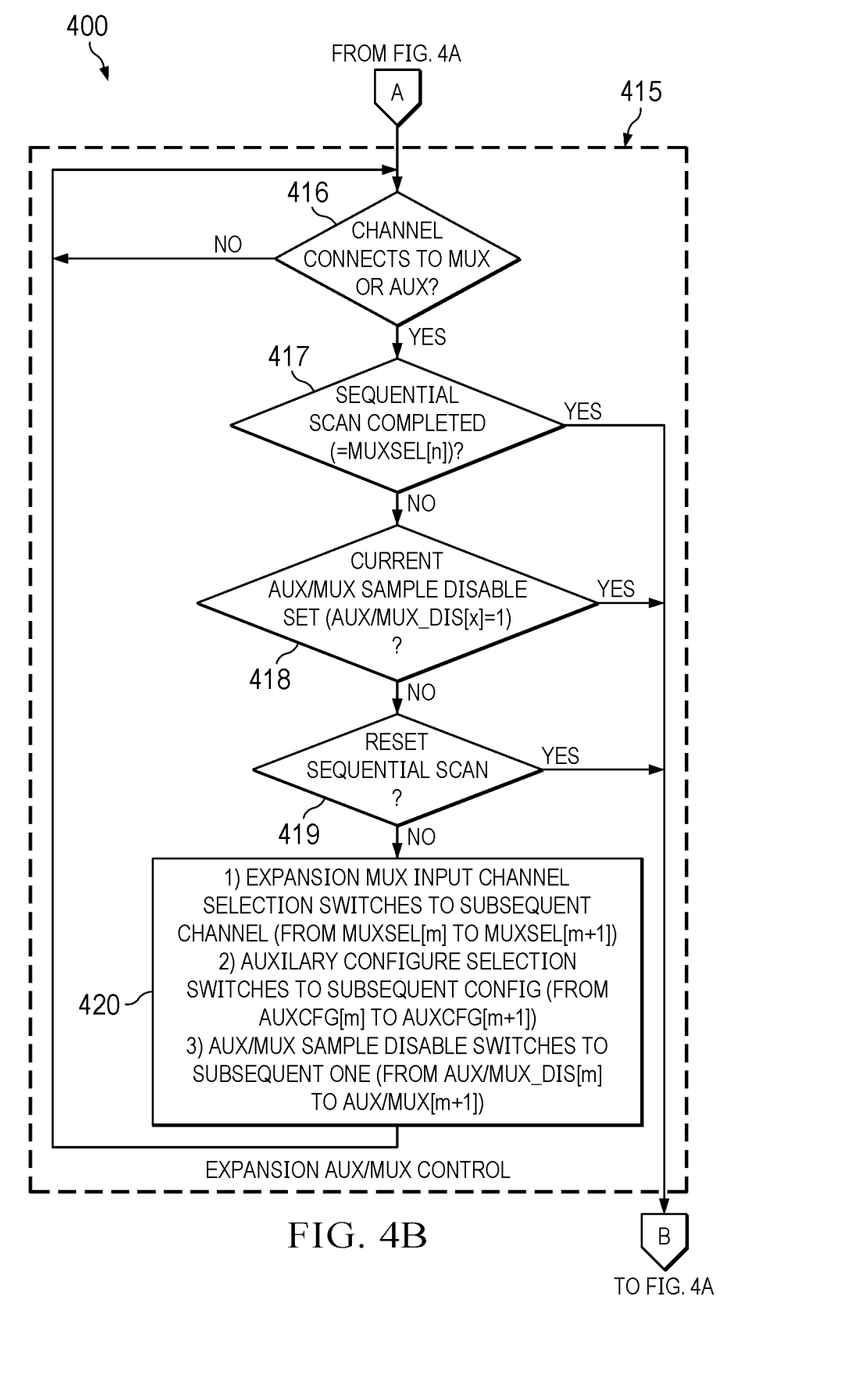

FIGS. 4A and 4B are a flowchart of an example of auto-sequential scan method 400 with expansion multiplexer(s) and auxiliary configuration control(s). In various embodiments, method 400 may be performed by components of ADC module 300. It should be noted that method 400 is provided for purposes of explanation only, and that FIGS. 4A and 4B are not intended to limit the scope of the subject matter.

As illustrated, method 400 begins at 401 where, prior to the start of an auto-sequence scan, predefined register values are written. Particularly, at 402, method 400 writes predefined values to: SC register 308, CH register 310, DIS register 312, MUXSEL register 352, and AUX/MUX disable register 334. Then, at 402, method 400 sets initial values for a first set of registers. Specifically, method 400 sets an initial CH register 310 value to 'CH0,' an initial SC register 308 value to 'SC0,' and an initial DIS register 312 value to 'DIS0.'

At 403, and still in preparation for the start of an auto-sequence scan, method 400 sets initial values for a second set of registers, including: setting an initial expansion MUX input channel selection register 352 value to MUXSEL[0], setting an initial AUXCFG selection register value to AUXCFG[0], and setting an initial AUX/MUX DIS register value to AUX/MUX_DIS[0].

After 403, method 400 is ready to begin an auto-sequential scan that includes ADC scan control operations 404 and expansion MUX and AUX configuration control operations 415. Particularly, at 405, method 400 determines if a hardware or software trigger is received. If so, at 406 method 400 samples an input signal following values currently stored in registers 308, 310, 312, 352, and 334. At 407, ADC converts the sample received at 406. The conversion result of ADC 306 is stored in sample result register 326.

At 408, method 400 determines whether the ADC sequential scan is completed. If so, control returns to block 402. Otherwise, at 409, method 400 determines whether the current DIS register value is set. If the output of 409 is 'yes,' the control returns to block 402. Otherwise, at 410, CH and DIS registers both switch to the next channel.

At 411, method 400 determines whether the ADC sequential scan has been halted by the current SC register value. If so, the SC register switches to the next channel at 412 and control returns to 405. If not, then at 413 the SC register also switches to the next channel but control returns to 406.

If at 414 method 400 receives a channel sample complete signal (e.g., signal 366), then expansion MUX and AUX configuration control operations 415 begin. Specifically, at 416, method 400 determines if the current channel is coupled to either the expansion MUX 360 (i.e., $IN_4$) or the auxiliary/signal conditioning circuit 344 (i.e., $IN_X$). If not, control stays with 416. If so, at 417 method 400 determines whether the sequential scan is completed. If the sequential scan is completed, control returns to 403, otherwise it passes to 418.

At 418 method 400 determines if the current AUX/MUX DIS value is set. If the value is set, control returns to 403, otherwise it passes to 419. At 419 method 400 determines whether a scan reset instructions has been received. If so, control returns to 403, otherwise it passes to 420. At 420, the expansion MUX channel selection register 352 switches to the next channel, the AUXCFG register 336 switches to the next configuration, the AUX/MUX disable register 334 also switches to the next value, and then control returns to 416.

As such, systems and methods described herein enable an ADC's auto-sequential scanning process to include the use of ADC expansion MUX(es) 360 as well as different configurations of auxiliary/signal conditioning circuit 344.

In an illustrative, non-limiting embodiment, an electronic circuit may include: a multiplexer; an ADC coupled to the multiplexer; and a control circuit coupled to the ADC and to the multiplexer, where the control circuit is configured to, as part of an auto-sequential scan, select one of a plurality of input channels coupled to the multiplexer via an expansion multiplexer.

In some cases, the multiplexer, the ADC, and the control circuit may be part of a semiconductor package, and the expansion multiplexer may be internal or external to the semiconductor package. The semiconductor package may include an SoC. Also, an output of the expansion multiplexer may be coupled to a fixed one of another plurality of input channels of the multiplexer.

As part of the auto-sequential scan, the control circuit may be configured to select a sequence of input channels among at least one of the plurality of input channels, or the other plurality of input channels, at non-periodic intervals and without generating an interrupt until the sequence is completed. The control circuit may be configured to manipulate: (i) a first set of registers to select one of the other plurality of input channels, and (ii) a second set of registers to select the one of the plurality of input channels.

The first set of registers may include a sample disable register, a scan mode register, and a channel list register. The control circuit may be configured to select a next one of the plurality of input channels in response to an indication that a sampling of any of the other plurality of input channels is completed. The second set of registers may include an expansion multiplexer channel selection register.

The second set of registers may include an expansion multiplexer disable register, and the control circuit may be configured to use the expansion multiplexer disable register to disable one or more of the plurality of input channels. The second set of registers may include an auxiliary configuration register. The control circuit may be configured to use the auxiliary configuration register to change a configuration of an input of an operational amplifier.

The configuration may be selected from the group consisting of: a unit gain follower, a gain amplifier, a differential amplifier, a low-pass filter, a high-pass filter, and an inverter. An output of the operational amplifier may be coupled to another fixed one of the other plurality of input channels of the multiplexer.

In another illustrative, non-limiting embodiment, a method may include starting an auto-sequential scan of a first plurality of input channels coupled to an ADC via a first multiplexer; and during the auto-sequential scan, selecting one of a second plurality of input channels coupled to a second multiplexer, where an output of the second multiplexer is coupled to one of the first plurality of input channels.

The method may also include during the auto-sequential scan, selecting a sequence of input channels among at least one of the first or second pluralities of input channels at non-periodic intervals and without generating an interrupt until the sequence is completed.

In some cases, selecting the one of the second plurality of input channels coupled to the second multiplexer may include reading a value stored in an expansion multiplexer channel selection register. Additionally, or alternatively, selecting the one of the second plurality of input channels coupled to the second multiplexer may include reading a value stored in an auxiliary configuration register. Yet additionally, or alternatively, selecting the one of the second plurality of input channels coupled to the second multiplexer may include reading an auxiliary configuration and expansion multiplexer disable register.

In yet another illustrative, non-limiting embodiment, an electronic device may include a microcontroller an ADC coupled to the microcontroller, where the ADC is coupled to a control circuit configured to select one of a plurality of input channels coupled to a multiplexer via an expansion multiplexer during an auto-sequential scan, where the expansion multiplexer is coupled to one of another plurality of input channels of the multiplexer, and the control circuit is configured to select a next one of the plurality of input channels in response to an indication that a sampling of any of the other plurality of input channels is complete.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, Internet-of-Things (IoT) devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

For sake of brevity, conventional techniques related to signal processing, sampling, sensing, analog-to-digital conversion, computer architecture, and PWM, have not been described in detail herein. Furthermore, the connecting lines shown in the various figures contained herein have been intended to illustrate relationships (e.g., logical) and/or physical couplings (e.g., electrical) between the various elements. It should be noted, however, that alternative relationships and connections may be used in other embodiments. Moreover, circuitry described herein may be implemented either in silicon or another semiconductor material or alternatively by software code representation thereof.

Although the invention(s) are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic circuit, comprising:
a multiplexer;
an Analog-to-Digital Converter (ADC) coupled to the multiplexer; and
a control circuit coupled to the ADC and to the multiplexer, wherein the control circuit is configured to, as part of an auto-sequential scan, select one of a plurality of input channels coupled to the multiplexer via an expansion multiplexer, wherein an output of the expansion multiplexer is coupled to a fixed one of another plurality of input channels of the multiplexer, and
wherein as part of the auto-sequential scan, the control circuit is configured to select a sequence of input channels among at least one of the plurality of input channels, or the other plurality of input channels, at non-periodic intervals and without generating an interrupt until the sequence is completed.

2. The electronic circuit of claim 1, wherein the multiplexer, the ADC, and the control circuit are part of a semiconductor package, and wherein the expansion multiplexer is internal or external to the semiconductor package.

3. The electronic circuit of claim 2, wherein the semiconductor package comprises a System-on-Chip (SoC).

4. An electronic circuit, comprising:
a multiplexer;
an Analog-to-Digital Converter (ADC) coupled to the multiplexer; and
a control circuit coupled to the ADC and to the multiplexer, wherein the control circuit is configured to, as part of an auto-sequential scan, select one of a plurality of input channels coupled to the multiplexer via an expansion multiplexer,
wherein the control circuit is configured to manipulate: (i) a first set of registers to select one of the other plurality of input channels, and (ii) a second set of registers to select the one of the plurality of input channels.

5. The electronic circuit of claim 4, wherein the first set of registers comprises: a sample disable register, a scan mode register, and a channel list register.

6. The electronic circuit of claim 4, wherein the control circuit is configured to select a next one of the plurality of input channels in response to an indication that a sampling of any of the other plurality of input channels is completed.

7. The electronic circuit of claim 4, wherein the second set of registers comprises an expansion multiplexer channel selection register.

8. The electronic circuit of claim 4, wherein the second set of registers comprises an expansion multiplexer disable register, and wherein the control circuit is configured to use the expansion multiplexer disable register to disable one or more of the plurality of input channels.

9. The electronic circuit of claim 4, wherein the second set of registers comprises an auxiliary configuration register.

10. The electronic circuit of claim 9, wherein the control circuit is configured to use the auxiliary configuration register to change a configuration of an input of an operational amplifier.

11. The electronic circuit of claim 10, wherein the configuration is selected from the group consisting of: a unit gain follower, a gain amplifier, a differential amplifier, a low-pass filter, a high-pass filter, and an inverter.

12. The electronic circuit of claim 11, wherein an output of the operational amplifier is coupled to another fixed one of the other plurality of input channels of the multiplexer.

13. The electronic circuit of claim 4, wherein the multiplexer, the ADC, and the control circuit are part of a semiconductor package, and wherein the expansion multiplexer is internal or external to the semiconductor package.

14. The electronic circuit of claim 13, wherein the semiconductor package comprises a System-on-Chip (SoC).

15. The electronic circuit of claim 4, wherein an output of the expansion multiplexer is coupled to a fixed one of another plurality of input channels of the multiplexer.

16. The electronic circuit of claim 15, wherein as part of the auto-sequential scan, the control circuit is configured to select a sequence of input channels among at least one of the plurality of input channels, or the other plurality of input channels, at non-periodic intervals and without generating an interrupt until the sequence is completed.

17. A method, comprising:
starting an auto-sequential scan of a first plurality of input channels coupled to an Analog-to-Digital Converter (ADC) via a first multiplexer;
during the auto-sequential scan, selecting one of a second plurality of input channels coupled to a second multiplexer, wherein an output of the second multiplexer is coupled to one of the first plurality of input channels; and
during the auto-sequential scan, selecting a sequence of input channels among at least one of the first or second pluralities of input channels at non-periodic intervals and without generating an interrupt until the sequence is completed.

18. A method, comprising:
starting an auto-sequential scan of a first plurality of input channels coupled to an Analog-to-Digital Converter (ADC) via a first multiplexer; and
during the auto-sequential scan, selecting one of a second plurality of input channels coupled to a second multiplexer, wherein an output of the second multiplexer is coupled to one of the first plurality of input channels,
wherein selecting the one of the second plurality of input channels coupled to the second multiplexer comprises reading a value stored in an expansion multiplexer channel selection register.

19. A method, comprising:
starting an auto-sequential scan of a first plurality of input channels coupled to an Analog-to-Digital Converter (ADC) via a first multiplexer; and
during the auto-sequential scan, selecting one of a second plurality of input channels coupled to a second multiplexer, wherein an output of the second multiplexer is coupled to one of the first plurality of input channels,
wherein selecting the one of the second plurality of input channels coupled to the second multiplexer comprises reading a value stored in an auxiliary configuration register.

20. A method, comprising:
starting an auto-sequential scan of a first plurality of input channels coupled to an Analog-to-Digital Converter (ADC) via a first multiplexer; and
during the auto-sequential scan, selecting one of a second plurality of input channels coupled to a second multiplexer, wherein an output of the second multiplexer is coupled to one of the first plurality of input channels,
wherein selecting the one of the second plurality of input channels coupled to the second multiplexer comprises reading an auxiliary configuration and expansion multiplexer disable register.

* * * * *